United States Patent [19]

Debrus et al.

[11] Patent Number: 5,598,527
[45] Date of Patent: Jan. 28, 1997

[54] COMPACT AND ERGONOMIC COMMUNICATIONS TERMINAL EQUIPPED WITH PROXIMITY DETECTION SURFACES

[75] Inventors: Marie-Héléne Debrus, Boulogne Billancourt; Philippe Gaultier, Le Chesnay; Patrick Vouillon, Villebon Sur Yvette, all of France

[73] Assignee: Sextant Avionique, Meudon La Foret, France

[21] Appl. No.: 424,605

[22] Filed: Apr. 17, 1995

Related U.S. Application Data

[63] Continuation of Ser. No. 142,915, Oct. 29, 1993, abandoned.

[30] Foreign Application Priority Data

Nov. 12, 1992 [FR] France ................................ 92 13798

[51] Int. Cl.⁶ ........................................ G09G 5/00
[52] U.S. Cl. ........................ 345/173; 345/168; 341/22
[58] Field of Search ........................... 345/173, 168, 345/171, 170, 207, 174; 341/22, 34, 33, 23; 178/18, 19; 379/370, 433

[56] References Cited

U.S. PATENT DOCUMENTS

| | | | |
|---|---|---|---|
| 3,123,676 | 3/1964 | Prescott et al. | 379/370 |
| 4,092,640 | 5/1978 | Sotoh | 345/170 |
| 4,310,839 | 1/1982 | Schwerdt | 345/173 |
| 4,566,001 | 2/1983 | Moore et al. | |
| 4,697,231 | 9/1987 | Boytor et al. | 345/173 |
| 4,821,029 | 4/1989 | Logan et al. | 345/173 |
| 4,920,237 | 4/1990 | Eardley et al. | 341/22 |
| 5,162,785 | 11/1992 | Fagard | 345/207 |
| 5,177,327 | 1/1993 | Knowles | 178/18 |
| 5,266,949 | 11/1993 | Rossi | 341/22 |
| 5,270,710 | 12/1993 | Gaultier et al. | 341/33 |

FOREIGN PATENT DOCUMENTS

| | | |
|---|---|---|
| 0474232 | 3/1992 | European Pat. Off. . |
| 0490712 | 6/1992 | European Pat. Off. . |
| 3123596 | 1/1983 | Germany ................. 379/433 |

*Primary Examiner*—Ulysses Weldon
*Assistant Examiner*—Regina Liang
*Attorney, Agent, or Firm*—Browdy and Neimark

[57] ABSTRACT

The compact and ergonomic communications terminal equipped with proximity detection surfaces embodying the invention comprises a screen and command device distributed around the periphery of the screen, the command device comprising two devices for detection on a respective axis of the position of an operator's finger, divided into a plurality of segments assimilable with switch operating keys, the axes of these two detection devices being perpendicular to one another and each disposed facing an edge of the screen. It is notably used inside the cockpit of an aircraft.

14 Claims, 3 Drawing Sheets

COMPACT AND ERGONOMIC COMMUNICATIONS TERMINAL EQUIPPED WITH PROXIMITY DETECTION SURFACES

This application is a continuation of application Ser. No.08/142,915, filed Oct. 29, 1993 now abandoned.

BACKGROUND OF THE INVENTION

1. Field of the Invention

This invention relates to a communications terminal particularly suited to ensuring man-machine communications notably, but not exclusively inside the cockpit of an aircraft.

2. Description of the Prior Art

In this context, the utilisation of terminals comprising a viewing screen integrated into a command device is known.

This command device comes either in the form of a keyboard fitted with keys integrated into the terminal, or in the form of a transparent touch-sensitive surface disposed against the screen.

In the form of a keyboard, the command device has the inconvenience of obliging the operator to continually displace his field of vision between the screen and the keyboard. In addition, this type of control means does not easily enable the designation of an area of the screen or the displacement of an object displayed on the screen.

In the form of a transparent touch-sensitive surface, the command device enables the inconveniences of the keyboard to be suppressed but is unusable with screens of small dimensions especially in the context of the cockpit of an aircraft. Indeed, when the operator puts his finger on this surface, e.g. to activate a command, he masks a large part of the screen with his hand.

Moreover, the applying of fingers on this surface inevitably leaves traces which, over time, affect the visibility of the screen.

Furthermore, a touch-sensitive surface on a screen does not enable the feeding back to the user of the confirmation of his action by mechanical perception of stress break.

For these reasons, the utilisation of a transparent touch-sensitive surface placed in front of the screen is difficult to envisage in the context of aviation where security instructions are very restricting.

Furthermore, modern aeronautical applications require the use of an increasingly bigger viewing screen, the dimensions of this surface being limited by the space available in a cockpit.

OBJECT OF THE INVENTION

The main object of this invention is to remedy the preceding disadvantages, particularly by increasing to a maximum the volume of the screen in relation to that occupied by the keyboard, without limiting the functionalities and ergonomics of the latter. To this end, it provides a man-machine communications terminal comprising a viewing screen and command means distributed around the periphery of the screen and comprising two detection devices each performing detection on a respective axis of the position of an object used as a dialog instrument, the axes of these two devices being perpendicular and each disposed facing an edge of the screen.

SUMMARY OF THE INVENTION

According to the invention, this terminal is characterized in that each of the two detection devices has a first operating mode enabling an operator's finger to be located on its detection axis, and a second operating mode according to which its detection axis is divided into a plurality of switching segments each constituting a switching zone assimilable with a switch operating key, each switching segment comprising means for triggering the second operating mode, and in that the two detection devices have a means for guiding and centering the operator's finger along their respective axes, and on each of the switching zones, In the first operating mode, this configuration enables any point on the screen to be designated. In fact, the positioning of the an operator's finger, on each perpendicular axis, respectively enables two perpendicular lines on the screen, and therefore the point of intersection of these two lines, to be designated.

It also enables the incrementing or decrementing of a variable displayed on the screen to be commanded by moving a finger along a detection axis.

The second operating mode enables e.g. validation of the activating of commands possibly defined on the screen, switching from one mode to the other being performed by operator action on the detection devices.

These dispositions enable the obtaining of an ergonomic communications terminal of small space requirements that can be used "blind" by way of the dialog instrument guiding and centering means. With suitable management electronics, this terminal can simultaneously provide the functionalities of a keyboard and a touch-sensitive surface within a volume barely greater than that of flat screens currently available.

Advantageously, the guiding means can consist of raised edges extending parallel to and on both sides of the detection axes, thus delimiting a longitudinal detection zone for each detection device.

Moreover, these raised edges can have scallopings each delimiting a detection segment.

According to a first embodiment, these detection devices are constituted by a plurality of double-operating-mode switches such as disclosed in U.S. patent application No. 07/799,252 filed in the name of the filing party hereof. These switches aligned on the detection axis comprise contact elements that can be operated by the effect of a pressure and used to perform a detection by capacitive effect of the proximity of the operator's finger.

It should be recalled that in a system of this type, accuracy in the determining of the position of the operator's finger can be rendered independent of the number of switches. To do so, the terminal management software need only compute an average weighted by coefficients representing the level of influence of each switch.

According to another embodiment of the invention, these detection devices use the principle of detection by acoustic waves propagating in a glass lamina.

This principle exploits the attenuation produced on the acoustic waves propagating in a glass lamina near the operator's finger exerting a pressure on the latter, the attenuation produced being a function of the pressure exerted by the object.

This last feature enables the behavior of a switch to be reproduced when the pressure exerted exceeds a certain threshold.

BRIEF DESCRIPTION OF THE DRAWINGS

Further features and advantages of the invention will be apparent from an embodiment of the terminal according to the invention described, by way of a non-limiting example, in reference to the corresponding accompanying drawings in which.

DESCRIPTION OF THE PREFERRED EMBODIMENTS

Figure 1:
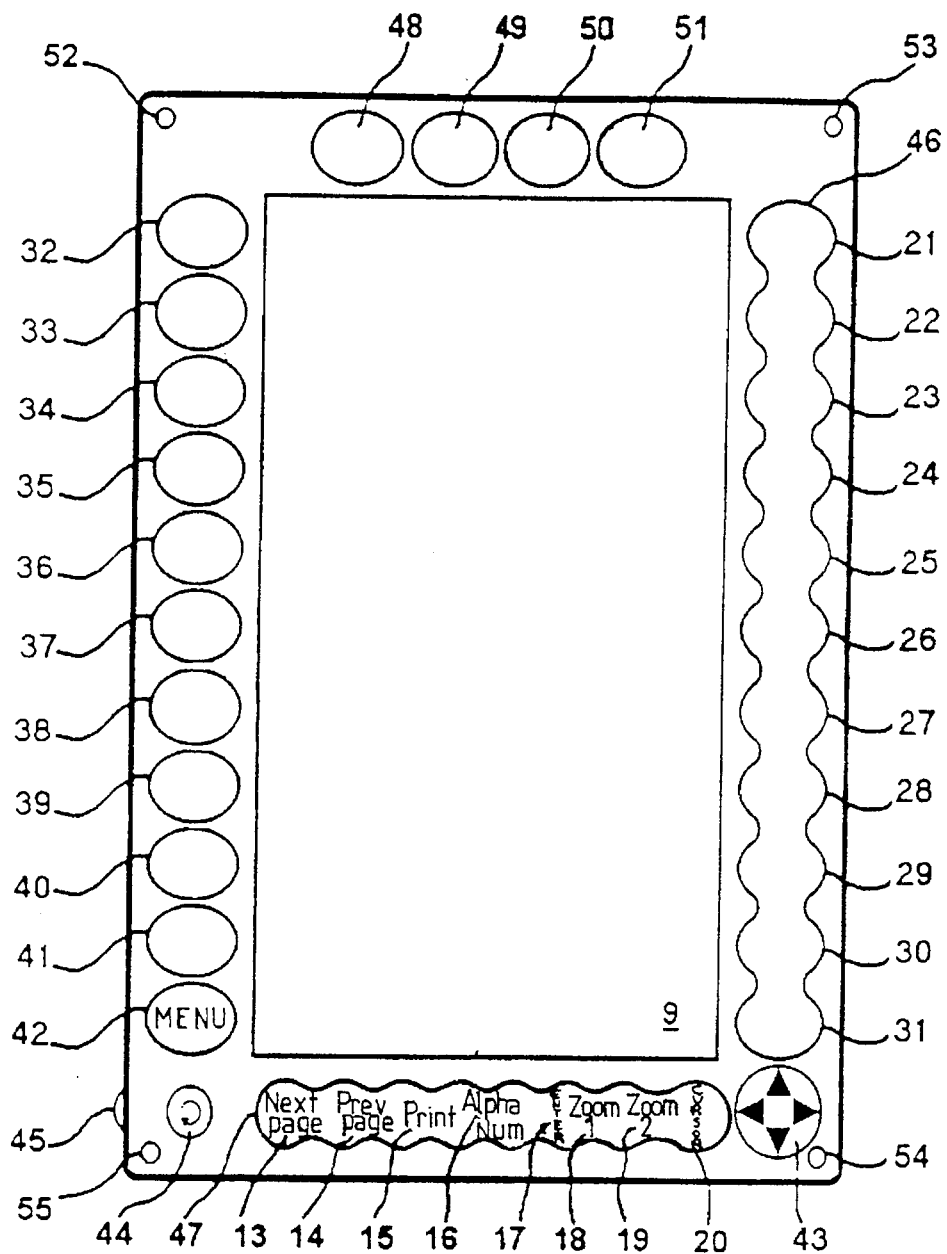
FIG. 1 schematically represents the communications terminal.

The communications terminal represented in FIG. 1 comprises a flat rectangular viewing screen 9 and a dialog device 10 disposed around the screen 9 respectively along the right and left hand sides and the top and lower edges of the screen.

It is in the shape of a parallelepiped of slightly larger dimensions than the viewing screen 9.

The screen is e.g. of the high-resolution, color liquid crystal type. Its dimensions are of the order of 15 cm by 20 cm, i.e. a 25-cm diagonal. It is protected by a multilayer anti-glare screen and is backlit by a lighting module comprised of fluorescent tubes of high luminescence and low diameter (4 to 6 mm).

The control electronics of the terminal are distributed around the screen and lighting module so that the terminal will be of reduced thickness.

The dialog device 10 comprises:

a first proximity detection band 46 with double operating mode extending along the right-hand edge of the screen 9 and divided into eleven switching segments 21 to 31;

a second proximity detection band 47 with double operating mode extending along the lower edge of the screen 9 and divided into eight switching segments 13 to 20;

four keys 48 to 51 disposed along the upper edge of the screen;

eleven keys 32 to 42 disposed along the left-hand edge of the screen;

a displacement key 43, situated in the lower right-hand corner of the screen 9 representing four arrows pointing in the four directions enabling displacement of an object displayed on the screen;

a knob 44 situated in the lower left-hand corner for powering the terminal up or down and for adjusting the lighting intensity of the screen.

Each of the proximity detection bands 46, 47 is delimited by raised edges so as to constitute a gutter with a U-shaped profile and enabling the finger to be guided along its detection axis. These edges have catching elements forming a scalloping on both sides of each switching segment in order to facilitate the centering of the finger on the switching zones.

Certain switching devices bear a caption, as is the case with segments 13 to 20 and the key 42 entitled "MENU" situated in the bottom left-hand corner of the screen. These captions indicate the function activated when the switching device is operated. These segments 13 to 20 enable activation of the functions relating to management of the terminal, namely, from left to right:

"NEXT PAGE" (13) which causes the next page to be displayed,

"PREV. PAGE" (14) which causes the previous page to be displayed,

"PRINT" (15) which enables printing of the screen to be launched,

"ALPHA/NUM" (16) which enables switching from an alphabetic input mode to a numeric input mode, and vice versa, "ENTER" (17) which enables an entry to be validated, "ZOOM 1" (18) and "ZOOM 2" (19) which enable the current page on the screen to be enlarged respectively according to two scale factors, and vice versa, and "CURSOR" (20) which enables a cursor to be displayed.

The key 42 entitled "MENU" enables displaying of the last menu having enabled the page displayed on the screen 9 to be accessed.

The dialog device 10 also comprises a printed circuit, cut out and positioned around the screen, which supports the keys 32 to 43 and 48 to 51 and the proximity detection bands 46, 47. It also supports a device for lighting the captions on the switching devices by night, controlled by a knob 45 situated near the bottom left-hand corner of the terminal, at the side.

The terminal management electronics comprise:

a module managing the dialog device, a module managing the inputs/outputs enabling it to communicate with external devices, a module managing the lighting of the screen, an adjustment module for the lighting intensity of the keys and proximity detection bands, and a forced ventilation module.

The screen lighting management module is coupled, on the one hand, with the adjustment knob 44 and, on the other hand, with four photodiodes 52 to 55 placed in the four corners of the terminal and measuring the illumination of the terminal's environment.

Figure 2:
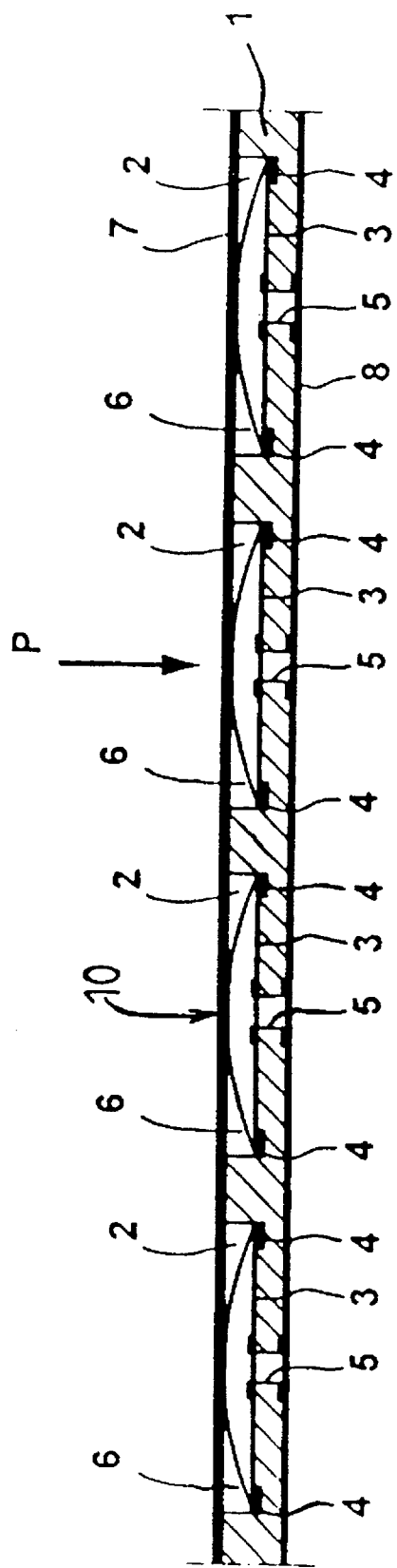
FIG. 2 is a schematic longitudinal section showing the mechanical structure of a proximity detection band according to a first embodiment.

In the example represented in FIG. 2, each proximity detection band is firstly comprised of a flat substratum 1, consisting e.g. of a printed circuit card, fitted with a plurality of cylindrical cavities 2 (countersinkings) each serving to accommodate a respective switch.

The bottom 3 of each of these cavities 2 is fitted with an annular metallization 4 of outside diameter substantially equal to the diameter of the cavity 2, and a central metallization 5 serving as fixed contact element.

Inside each of these cavities 2 is disposed a dome-shaped elastically deformable metal capsule 6 whose circular base is of diameter substantially equal to the diameter of the cavity 2. Accordingly, this capsule 6 sits by its base on the annular metallization 4, while the central part extends above the central metallization 5.

The capsules 6 are maintained within the recesses by means of a film 7 of elastically deformable plastic material which covers the upper side of the substratum 1 and is fixed to the latter e.g. by bonding.

Figure 3:
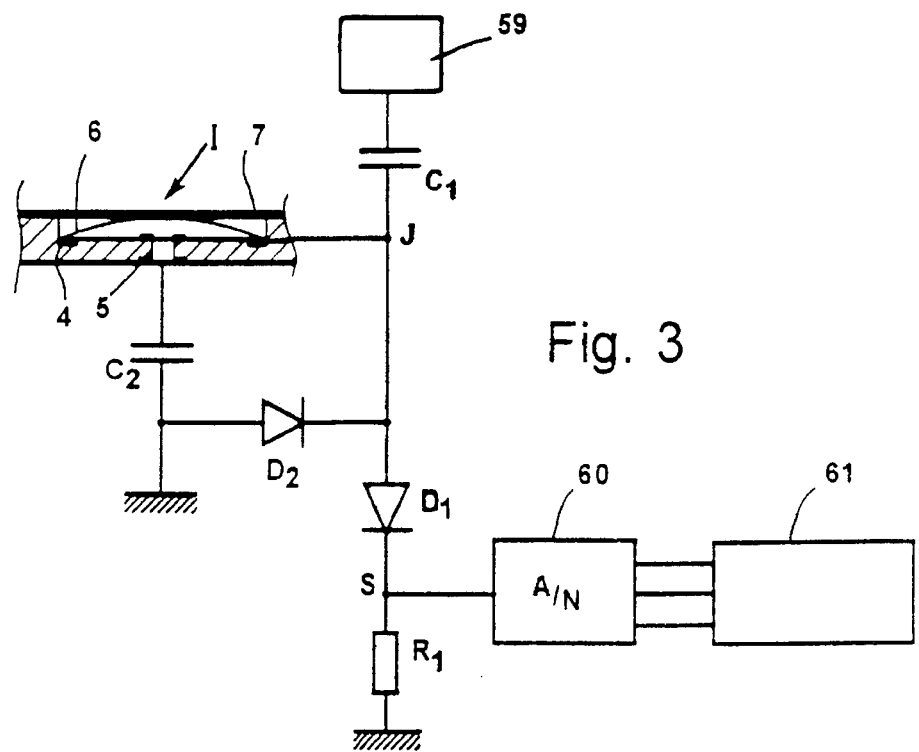
FIG. 3 is a skeleton diagram of an electronic circuit that can be associated with a switch of the type of those represented in FIG. 2.

Advantageously, the inner side of the substratum 1 bears an electronic circuit connected electrically to the annular metallizations 4 and to the central metallizations 5 (FIG. 3).

It is evident that, at rest, the central part of each capsule 6 is separated from the central metallization 5. The switch formed by these two elements is then in the OFF position.

From this position, a pressure P exerted on the summit of the capsule 6 will cause an elastic deformation of the capsule 6 which, after an inversion of the concavity (tactile effect), comes to bear on the central metallization 5. The switch is then ON.

In order to perform a proximity detection, each metallization 4 and 5 need only be connected to a capacity measuring circuit.

This circuit is powered by a generator 59 issuing a periodical high-frequency signal (FIG. 3). This signal is applied, via a capacitor C1, on the one hand, to the annular metallization 4 of the switch I and, on the other hand, to the anode of a diode D1 and to the cathode of a diode D2 whose anode is grounded. As for the central metallization 5 of the switch I, it is connected to the ground via a capacitor C2 of relatively high capacity.

The cathode of the diode D1, corresponding to the point S where the level of voltage representative of the status of the switch I is measured, is grounded via a resistor R1.

When the switch I is in the OFF state and in the absence of a conductive element near the capsule 6, the signal applied by the generator 59 is rectified and filtered. A first voltage level is obtained at the point S.

The presence of an electrically conductive body, e.g. an operator's finger, near the capsule 6 has the effect of introducing a stray capacity between the point S and the ground. As a result, a leakage current is established which attenuates the voltage at S and which therefore produces a second voltage level well below the first one.

In the case of the switch I being ON, the generator is grounded via the capacitors C1 and C2. If the capacity of the capacitor C2 is sufficiently high, the voltage at point S is very weak or even nil.

To determine the status of the switch I, all that need be done is to analyze the voltage of the signal sampled off at the point S.

This operation can, of course, be performed by an analog system (proceeding e.g. by comparison of the voltage with thresholds) so as to discern the three levels of voltage.

It can also be performed quite simply by a digital circuit comprising an analog-to-digital converter 60 whose input is connected to the point S and whose output is processed by a circuit 61 which is part of the dialog device management module.

The circuit 61 accurately measures the voltage level at point S and performs a software processing enabling discrimination of the situation of each switch which can be:

uninfluenced: in which case no action is triggered,

ON: the order to activate the command associated with the switch is then sent to the terminal management module, or influenced by the proximity of a finger: a coefficient representative of the importance of this influence is then digitized and memorized in order to accurately determine the position of the finger by computation of the weighted average.

In this last case, if just one switch is influenced, the finger is situated on the switch. Conversely, if two switches are influenced, the finger is located between the two. The dialog device management module then computes the average weighted by the coefficients associated with the two switches and thus determines the position of the finger on the axis of detection in relation to a fixed origin. With a digital computation of ten bits, a resolution of one thousand and twenty-four points is obtained per detection band. In this manner, the position of the finger is determined with an accuracy independent of the number of switches belonging to the band provided the distance between the center of each switch is limited (in order for two switches to be capable of being influenced at the same time).

In addition, the sensitivity of the detection bands 46, 47 is set by thresholds taking parasitic influences into account (temperature, noise of the analog signals, etc.). It is adjusted to accept utilisation with or without gloves.

In order to be able to detect finger movement on each of these bands 46, 47, the scanning cycle is sufficiently fast to be able to measure the position of the finger on its axis and to continuously transmit to the terminal manager. In this way, it is possible to reconstitute the motion of the finger on the axis of the band and to take it into account immediately.

These proximity detection bands, disposed along the edges of the screen, provide numerous possibilities.

They notably enable:

the designating of any point whatsoever on the screen by designation of a point on each of the two detection bands; designation of a point on a detection band enabling a line perpendicular to the axis of detection to be designated;

the commanding of the incrementing or decrementing of a variable from the amplitude of finger displacement on a detection axis and from the direction thereof;

the commanding of the displacement of a cursor or of an image;

management of a menu;

or, commanding of the displacement of a viewing area within a book, the vertical band 46 enabling displacement of the zone of the page displayed on the screen, and the horizontal band 47 enabling the pages to be turned.

In the case of management of the menus, the menus can be presented over plural columns, thereby enabling a large number of possible choices to be proposed. The horizontal band 47 then enables a column to be selected, while the vertical band 46 enables a line to be selected.

In the case of an image displayed on the screen being bigger than the latter, the associating of such bands 46, 47 with the command key 43 for displacement of a cursor enables both the cursor to be displaced on the screen in order to designate an object of the image, and the image to be displaced in relation to the screen in order to view another part of the image.

The assigning of a function to these sensitive bands is advantageously performed as a function of the application in process on the terminal.

Such a terminal, having space requirements only slightly greater than those of a flat screen, thus provides considerable convenience of utilisation.

According to another embodiment, the proximity detection bands 46,47 implement the principle of single axis detection by internal acoustic waves propagating in a glass lamina.

Figure 4:
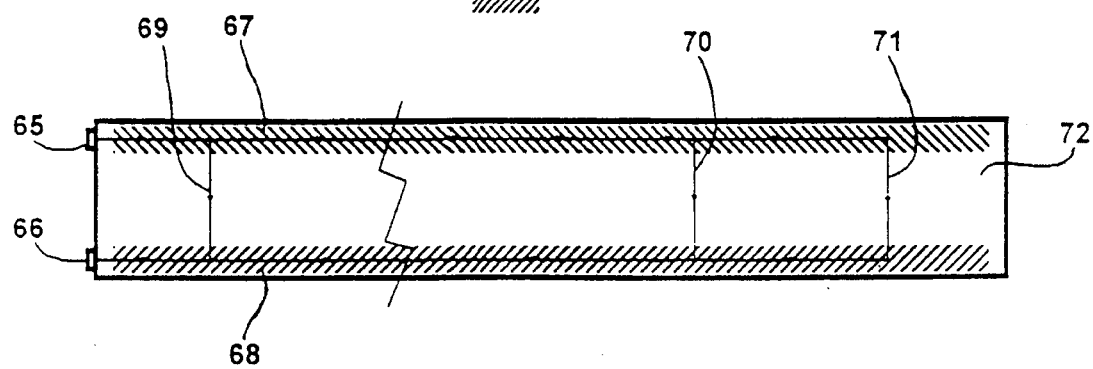
FIG. 4 schematically represents a top view of a proximity detection band according to a second embodiment.

According to the diagram presented in FIG. 4, acoustic waves are emitted by a transmission transducer 65, at one end of the proximity detection band, in the mass of a glass lamina 72 at least 1 mm thick and forming the detection band. By means of a first set of reflectors 67, disposed at an angle of 45° to the longitudinal axis of the band, on the path of the acoustic waves emitted by the transducer 65, the acoustic waves are reflected in a perpendicular direction following a multiplicity of paths of different lengths, distributed over the entire surface of the glass lamina, e.g. 69, 70, 71, towards a second set of reflectors 68.

The reflectors in the second set 68 are also disposed at an angle of 45° to the direction of the incident acoustic waves and enable the acoustic waves to be sent, in a direction opposite the direction of transmission, to a reception transducer 66.

The reception transducer 66 transforms the acoustic waves it receives into an electric signal which is sent to an electronic analysis device that is part of the dialog device management module.

When the finger of an operator presses on the surface of the glass lamina, there occurs a phenomenon of local attenuation of the acoustic waves traveling along the path disturbed by the finger.

In order to determine the position e.g. of a finger, the analysis device is designed to detect both an attenuation and the path concerned, each path corresponding to a position on the detection axis. As this attenuation is a function of pressure exerted by the finger, the analysis device also determines this pressure.

The response time of the analysis device is sufficiently sizeable to enable the finger movements to be followed.

Utilisation of such proximity detection bands thus enables thresholds to be set to discriminate the operator's actions and to reproduce double operation: for a pressure corresponding to a light touch, the band behaves as a touch-sensitive work board, whereas for clearly greater pressures, the band behaves as a set of keys enabling functions to be activated or parameters to be validated, the position of the keys being marked by labels placed beneath the glass lamina.

Figure 5:
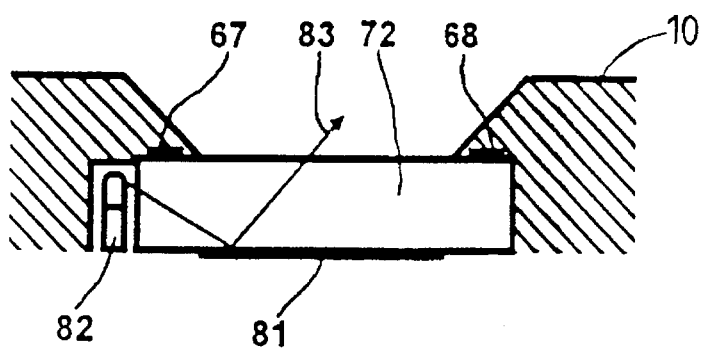
FIG. 5 is a transversal section of the proximity detection band represented in FIG. 4.

The glass laminae 72 constituting these detection bands 46,47 can be easily lit from the edge by means of miniature lamps or light emitting diodes 82 (FIG. 5). The rays of light 83 thus emitted are then reflected by the labels 81 bearing the names of the keys.

A multifunction dialog device with night lighting is thus obtained with low space requirements.

We claim:

1. A man-machine communications terminal comprising a viewing screen and command means distributed around the periphery of the screen and comprising two detection devices, each detecting a position of a finger of an operator on a respective axis thereof, the axes of these two devices being perpendicular and each disposed facing an edge of the screen, each of said two detection devices having a first operating mode, enabling an object to be located on its detection axis, and a second operating mode according to which its detection axis is divided into a plurality of switching segments each constituting a switching zone assimilable with a switch operating key, each switching segment of said switching segments comprising means for triggering said second operating mode, said two detection devices further having means for guiding said finger along their respective axes, and means for centering said finger on each of said switching zones, wherein the means for guiding and the means for centering have a structure raised above an upper surface of each of said two detection devices for respectively guiding said finger along the axes of the two detection devices and centering said finger respectively on each of the switching zones, said upper surface being entirely flat and smooth, wherein the means for guiding consists of raised edges along a longitudinal axis which extends parallel to and on both sides of the axes of the detection devices so as to form with the upper surface of each of said two detection devices a gutter with a U-shaped profile, and the means for centering consist of scallopings arranged on each of the raised edges, each of which delimits a switching segment, means for activating the means for triggering the second operating mode when said finger exerts a pressure exceeding a certain threshold on a switching segment, wherein each of said switching segments being positioned below the upper surface and being a switch constituted by at least a fixed contact element and a mobile contact element which is applied on the fixed contact element under the effect of a pressure exceeding said certain threshold, said contact elements being used to detect the proximity of an electrically conductive finger by capacitive effect.

2. The communications terminal as claimed in claim 1, wherein the position of said finger along the detection axis of each of said two detection devices is determined by computation of an average weighted by coefficients representing the level of excitation of said switching segments.

3. The communications terminal as claimed in claim 1, wherein each of the detection devices is constituted by a glass lamina and comprises:

a transmission transducer means for acoustic waves in the mass of said glass lamina, a means for redirecting said acoustic waves according to a multiplicity of paths of different lengths respectively associated with different positions of said finger along the detection axis of each of said detection devices, a reception transducer means for the acoustic waves propagating in said glass lamina, a means for redirecting said acoustic waves traveling along multiple paths towards said reception transducer means, a means for analyzing the signal supplied by the reception transducer means, capable of detecting a damping of acoustic wave amplitude caused by the presence of an object bearing on said glass lumina, and capable of determining which of the multiple paths has been traveled by the acoustic wave whose amplitude has been damped by said finger, said path enabling the position of said finger to be determined along the detection axis.

4. The communications terminal as claimed in claim 3, wherein the means for analyzing the signal supplied by said reception transducer means is capable of measuring said damping in order to determine the pressure exerted by said finger on said glass lamina, said pressure being a function of said damping.

5. The communications terminal as claimed in claim 4, wherein said signal analyzing means activates the second operating mode when the pressure measured exceeds said certain threshold.

6. The communications terminal as claimed in claim 3, wherein the detection devices comprise means for lighting said glass lamina by its edge and labels placed under the glass lamina, each label indicating the name of the command triggered when pressure is exerted thereon.

7. The communications terminal as claimed in claim 1, comprising photodiodes measuring illumination thereof, a screen lighting device, and a management module for this lighting capable of controlling it as a function of the illumination measured by said photodiodes.

8. A man-machine communications terminal comprising:

a viewing screen, two perpendicular command strips distributed around a periphery of the screen, each of said two command strips comprising a top contact surface and a bottom surface, the top contact surface being entirely flat and smooth;

touch sensitive means located between the top contact surface and bottom surface for locating on the screen a position of a finger of an operator when moved on said top contact surface along a longitudinal axis of each of said two command strips;

a plurality of switch segment means located between the top contact surface and the bottom surface, each of said plurality of switch segment means spaced apart along each said longitudinal axis for identifying information to be introduced onto the screen when pressed by said finger;

each of said two command strips having means for guiding said finger when moved along each said longitudinal axis and means for centering said finger over each of said plurality of switch segment means, wherein said means for guiding and the means for centering have raised edges above and at both sides of the top contact surface to maintain said finger therebetween and on each said longitudinal axis, and scallops respectively formed in the raised edges around each of said plurality of switch segment means to center the finger thereover;

a cross-section through each of said two command strips having a U-shaped profile forming a gutter with a top contact surface along each said longitudinal axis, wherein each of said switching segment means below a top contact surface is a switch key constituted by at least a fixed contact element and a mobile contact element which is applied on the fixed contact element under the effect of a pressure exceeding a certain threshold, said fixed contact element and said mobile contact element being used to detect the proximity of said finger by capacitive effect.

9. The communication terminal as claimed in claim 8, wherein the position of the finger along the axis of each of said two command strips is determined by computation of an average weighted by coefficients representing the level of excitation of the touch sensitive means.

10. The communications terminal as claimed in claim 8, wherein each of the command strips is constituted by a glass lamina wherein said touch-sensitive means comprises:

a transmission transducer means for acoustic waves in the mass of said glass lamina, a means for redirecting said acoustic waves according to a multiplicity of paths of different lengths respectively associated with different positions of the finger along the axis of each of said command strips, a reception transducer means for the acoustic waves propagating in said glass lamina, a means for redirecting said acoustic waves traveling along multiple paths towards said reception transducer means, a means for analyzing the signal supplied by the reception transducer means, capable of detecting a damping of acoustic wave amplitude caused by the presence of a finger of an operator on said glass lamina, and capable of determining which of the multiple paths has been traveled by the acoustic wave whose amplitude has been damped by the finger, said path enabling the position of the finger to be determined along the axis.

11. The communication terminal as claimed in claim 10, wherein the means for analyzing the signal supplied by said reception transducer means is capable of measuring said damping in order to determine the pressure exerted by said finger on said glass lamina, said pressure being a function of said damping.

12. The communications terminal as claimed in claim 11, wherein said signal analyzing means activates a switch segment of said switch segment means when the pressure measured exceeds said certain threshold.

13. The communication terminal as claimed in claim 10, wherein the command strips comprise means for lighting said glass lamina by its edge and labels placed under the glass lamina, each label indicating the name of the the switch segment triggered when pressure is exerted thereon.

14. The communications terminal as claimed in claim 8, comprising photodiodes measuring illumination thereof, a screen lighting device, and a management module for this lighting capable of controlling it as a function of the illumination measured by said photodiodes.

* * * * *